US005862314A

United States Patent [19]

Jeddeloh

[11] Patent Number: 5,862,314

[45] Date of Patent: Jan. 19, 1999

[54] SYSTEM AND METHOD FOR REMAPPING DEFECTIVE MEMORY LOCATIONS

[75] Inventor: Joseph Jeddeloh, Minneapolis, Minn.

[73] Assignee: Micron Electronics, Inc., Nampa, Id.

[21] Appl. No.: 741,603

[22] Filed: Nov. 1, 1996

[51] Int. Cl.[6] ..................................................... G06F 11/00

[52] U.S. Cl. ..................................................... 395/182.06

[58] Field of Search ......................... 395/182.06, 182.05, 395/182.04; 371/10.2, 10.3, 21.6

[56] References Cited

U.S. PATENT DOCUMENTS

| | | | |
|---|---|---|---|
| 5,553,231 | 9/1996 | Papenberg et al. | 395/182 |
| 5,602,987 | 2/1997 | Haran et al. | 395/182 |

*Primary Examiner*—Vincent P. Canney
*Attorney, Agent, or Firm*—Seed and Berry LLP

[57] ABSTRACT

A computer system includes a memory requester that interfaces with a memory module that includes memory portions. An error map that identifies the defective memory portions of the memory module is created and stored in the computer system. Using the error map, a remapping table that maps each of the defective memory portions to a non-defective memory portion in the memory module is created and then stored. In response to receiving from the memory requester a request for access to a requested memory portion of the memory module, a determination is made from the error map whether the requested memory portion is one of the defective memory portions. If the error map indicates that the requested memory portion is one of the defective memory portions, then a determination is made from the remapping table the non-defective memory portion to which the requested memory portion is mapped. The non-defective memory portion is accessed if the error map indicates that the requested memory portion is defective, and the requested memory portion is accessed if the error map does not indicate that the requested memory portion is defective.

25 Claims, 2 Drawing Sheets

50
Detect defective memory portions
52
Create error map
54
Store error map in non-volatile memory
56
Transfer error map to controller memory
58
Determine non-defective reserved memory region
60
Create remapping table
62
Store remapping table in reserved memory region

SYSTEM AND METHOD FOR REMAPPING DEFECTIVE MEMORY LOCATIONS

TECHNICAL FIELD

The present invention relates to computer memory, and more particularly, to overcoming defective memory locations.

BACKGROUND OF THE INVENTION

Substantially all modern electronic computers rely on semiconductor memory to store data for processing by a central processing unit (CPU). Such computers employing semiconductor memory vary from simple computers, such as those contained in telephone answering machines, to highly complex supercomputers employed for complicated scientific projects. In simple computers like those used for telephone answering machines, errors in one or more of the memory locations of the memory may not be fatal. For example, a mistake in the memory of the telephone answering machine likely would only cause the synthesized voice stored on the memory to be imperceptibly altered. However, one or more defective memory locations in a memory of a computer used to perform scientific calculations may cause substantial problems.

Although current manufacturing techniques have substantially reduced the number of defective memory locations, computer memory still is susceptible to such defective memory locations. Those defective memory locations can be caused by any of numerous steps taken during manufacture of the memory chips, semiconductor crystalinity defects, electrical connector discontinuities, etc. Although memory chips with such defective memory locations typically represent a small portion (less than 1%) of the total number of memory chips produced, the actual number of such defective memory chips is substantial. In the past, extra rows of memory cells, known as "redundant rows" were provided that could be used to replace rows having defective memory cells. While the use of redundant rows is successful in salvaging otherwise defective memory chips, the number of defective rows that can be replaced is limited to the number of redundant rows that are provided on the memory chip. The number of defective rows sometimes exceeds the number of available redundant rows, thus preventing repair of some defective rows. In some cases, such defective memory chips could be sold at a greatly reduced price for applications that do not require perfect memory, such as for telephone answering machines. However, it would be beneficial if some of those memory chips could be employed in more critical applications, such as in personal computers.

One way to enable such defective memory chips to be incorporated into personal computers would be to employ error correction schemes to compensate for defective memory locations. Error correction schemes add to each data word plural error correction bits that enable the data word to be reconstituted in the event of an erroneous data bit within the data word. However, such prior art error correction schemes typically only reconstitute a data word if only a single bit of the data word is erroneous. Moreover, such error correction schemes add several extra data bits to each data word which results in high memory overhead. In addition, such error correction schemes could be extended to detect multiple erroneous data bits, but the memory overhead that would result likely would be unacceptable.

SUMMARY OF THE INVENTION

A preferred embodiment of the present invention is directed to a method and computer system for interfacing a memory requester with a memory module that includes defective memory portions. The method creates and stores an error map that identifies the defective memory portions of the memory module. Using the error map, the method creates and stores a remapping table that maps each of the defective memory portions to a non-defective memory portion in the memory module. The error map is preferably created and stored in a non-volatile memory block of the memory module and the remapping table is then created from the error map and stored in a volatile memory block of the memory module each time power is applied to the system. In response to receiving from the memory requester a request for access to a requested memory portion of the memory module, the method determines from the error map whether the requested memory portion is one of the defective memory portions. If the error map indicates that the requested memory portion is one of the defective memory portions, then the method determines from the remapping table the non-defective memory portion to which the requested memory portion is mapped. The method accesses the non-defective memory portion if the error map indicates that the requested memory portion is one of the defective memory portions and accesses the requested memory portion if the error map does not indicate that the requested memory portion is one of the defective memory portions. In providing the ability to access a non-defective memory portion when a defective memory portion is requested, the preferred embodiment invention enables memory modules with defective memory locations to be employed in error-sensitive computer applications.

DETAILED DESCRIPTION OF THE INVENTION

Figure 1:
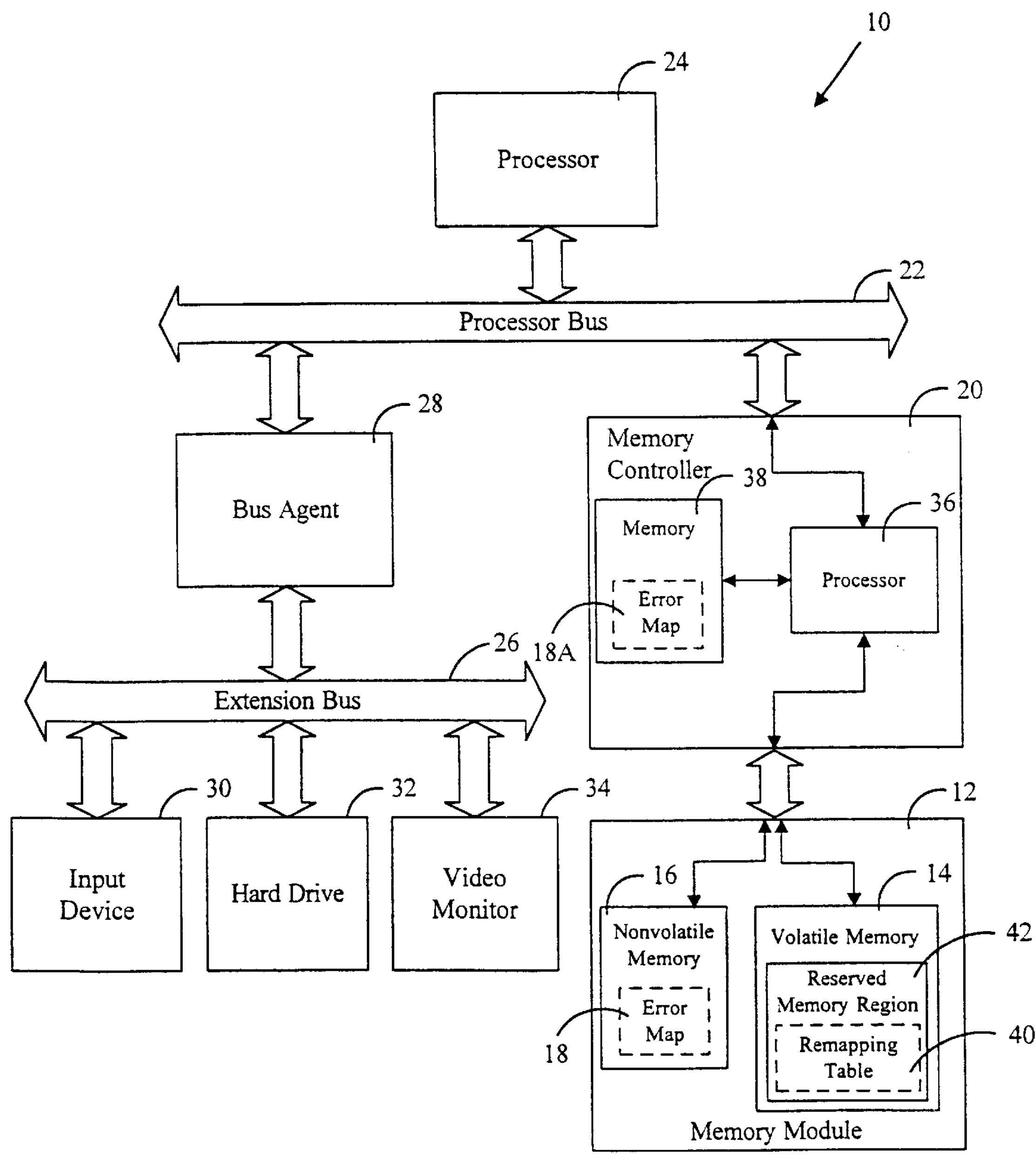
FIG. 1 is a block diagram of a computer system for remapping defective memory locations of a memory module according to a preferred embodiment of the present invention.

A computer system 10 for servicing memory access requests directed to a memory module 12 is shown in FIG. 1. The memory module 12 can be any of numerous types of memory modules, such as a double in-line memory module (DIMM). The memory module 12 includes a volatile memory block 14 that includes numerous volatile memory locations. The volatile memory block 14 preferably includes one or more dynamic random access memory (DRAM) chips, but the invention is equally applicable for other types of volatile memory, such as static random access memory (SRAM). The volatile memory block 14 may include one or more defective volatile memory portions in addition to numerous non-defective volatile memory portions. In contrast to prior art memory modules, the memory module 12 includes a nonvolatile memory block 16 that stores an error map 18. The error map 18 includes, for each of the defective volatile memory portions of the volatile memory block 14, an error tag that indicates that the volatile memory portion is defective. The nonvolatile memory block 16 can be composed of any type of semiconductor nonvolatile memory, such as erasable programmable read only memory (EPROM) and electrically erasable programmable read only memory (EEPROM).

Preferably, the error map 18 is created in the factory that makes the volatile memory block 14 based on well-known tests that determine which memory portions of the volatile memory block 14 are defective. In one embodiment, every single memory location is tested to determine whether it is defective, and if so, an error tag is created for the defective memory location. In another embodiment, larger memory portions, such as four kilobyte groups of memory locations, are tested to determine whether the four kilobyte memory portions are defective. Accordingly, as used herein, the term “memory portion” refers broadly to either a single memory location or a group of plural memory locations.

The memory module 12 interfaces with the remainder of the computer system 10 via a memory controller 20 and a processor bus 22 to a computer processor 24. As is typical, the computer system 10 also includes an extension bus 26 that is coupled to the processor bus 22 by a bus agent 28. Coupled to the extension bus 26 are an input device 30, such as a keyboard, mouse, or electronic pen/tablet, a hard drive 32 and a video monitor 34. The hard drive 32 in effect, is a nonvolatile memory device that stores data and computer instructions that are processed by the computer processor 24 after the data and computer instructions are transferred to the volatile memory block 14 of the memory module 12.

When the computer system 10 is turned ON, a processor 36 in the memory controller 20 retrieves a copy 18A of the error map 18 from the nonvolatile memory block 16 of the memory module 12. The memory controller processor 36 stores the error map 18A in a memory 38, which typically will be a nonvolatile memory device such as DRAM or SRAM. Alternatively, the memory 38 could be a nonvolatile memory device, such as an EEPROM, to enable the error map 18A to be permanently stored in the memory controller 20. However, such nonvolatile memory devices usually are much slower than volatile memory devices.

As discussed above, the error map 18 includes an error tag for each of the defective volatile memory potions of the volatile memory block 14. Preferably, the error map 18 is implemented by associating an error tag with each defective volatile memory portion and a non-error tag for each non-defective volatile memory portion. For example, the error tag may be a tag bit of a first logic value, such as 0, if the memory portion is defective and the non-error tag may be a tag bit of a second logic value, such as 1, if the memory portion is not defective. Alternatively, the error map 18 can simply include the addresses of the defective memory portions such that the addresses not listed are assumed to be non-defective.

In response to receiving the copy 18A of the error map 18 from the nonvolatile memory block 16 of the memory module 12, the memory controller processor 36 creates a remapping table 40. The remapping table 40 maps each of the defective memory portions to a memory portion of the volatile memory block 14 that is known to be non-defective. In other words, for each defective memory portion of the volatile memory block 14, the remapping table 40 includes an index that points to a non-defective memory portion of the volatile memory 14. Preferably, the memory controller processor 36 stores the remapping table 40 in a non-defective memory portion of the volatile memory block 14. Alternatively, the memory controller processor 36 could store the remapping table 40 in the memory 38 of the memory controller 20. However, the amount of storage space available in the memory 38 is likely to be limited while much more space is likely to be available in the volatile memory block 14 of the memory module 12.

The memory portions to which the defective memory portions are being mapped preferably are located in a reserved memory region 42 of the volatile memory block 14 that cannot be directly accessed by the system processor 24. Further, the remapping table 40 preferably is also stored in the reserved memory region 42. By protecting the reserved memory region 42 from direct access by the system processor 24, the computer system 10 prevents memory access conflicts that would occur if the system processor 24 could overwrite the memory portions that are occupied by the remapping table or by the memory portions to which the defective memory portions are mapped. The memory controller processor 36 can protect the reserved area of the volatile memory 14 by not telling the operating system of the system processor 24 that the reserved memory region 42 exists.

After the error map 18 and the remapping table 40 are stored in the appropriate locations in memory 38 and the volatile memory block 14, respectively, the memory module 12 and the memory controller 20 are ready to receive requests for access to the memory portions of the volatile memory block 14. The memory controller 20 receives from the system processor 24 via the processor bus 22 a request for access to a requested memory portion of the memory module 12. The memory controller processor 36 responds by determining from the error map 18A of the memory 38 whether the requested memory portion is one of the defective memory portions. If the error map 18A indicates that the requested memory portion is not one of the defective memory portions, then the memory controller processor 36 simply accesses the requested memory portion from the volatile memory block 14. If the error map 18A indicates that the requested memory portion is one of the defective memory portions, then the memory controller processor 36 accesses the remapping table 40 stored in the volatile memory block 14. The memory controller processor 36 determines from the remapping table 40 the non-defective memory portion to which the requested memory portion is mapped. Further, the memory controller processor 36 accesses the non-defective memory portion determined from the remapping table 40 and performs the function requested by the memory access request. For example, if the memory access request was a request to read data from the requested memory portion, then the memory controller processor 36 reads the data from the non-defective memory portion to which the requested memory portion is mapped and returns the data to the system processor 24 via the computer bus 22.

The entire process of creating and storing the error table 18, creating and storing the remapping table 40, and responding to memory access requests using the error map 18A and the remapping table 40 is transparent to the system processor 24. As a result, there is no need for the software being run by the system processor 24 to be modified in any way to operate in conjunction with the memory module 12 or the memory controller 20 of the preferred embodiment of the present invention.

Figures 2, 3:
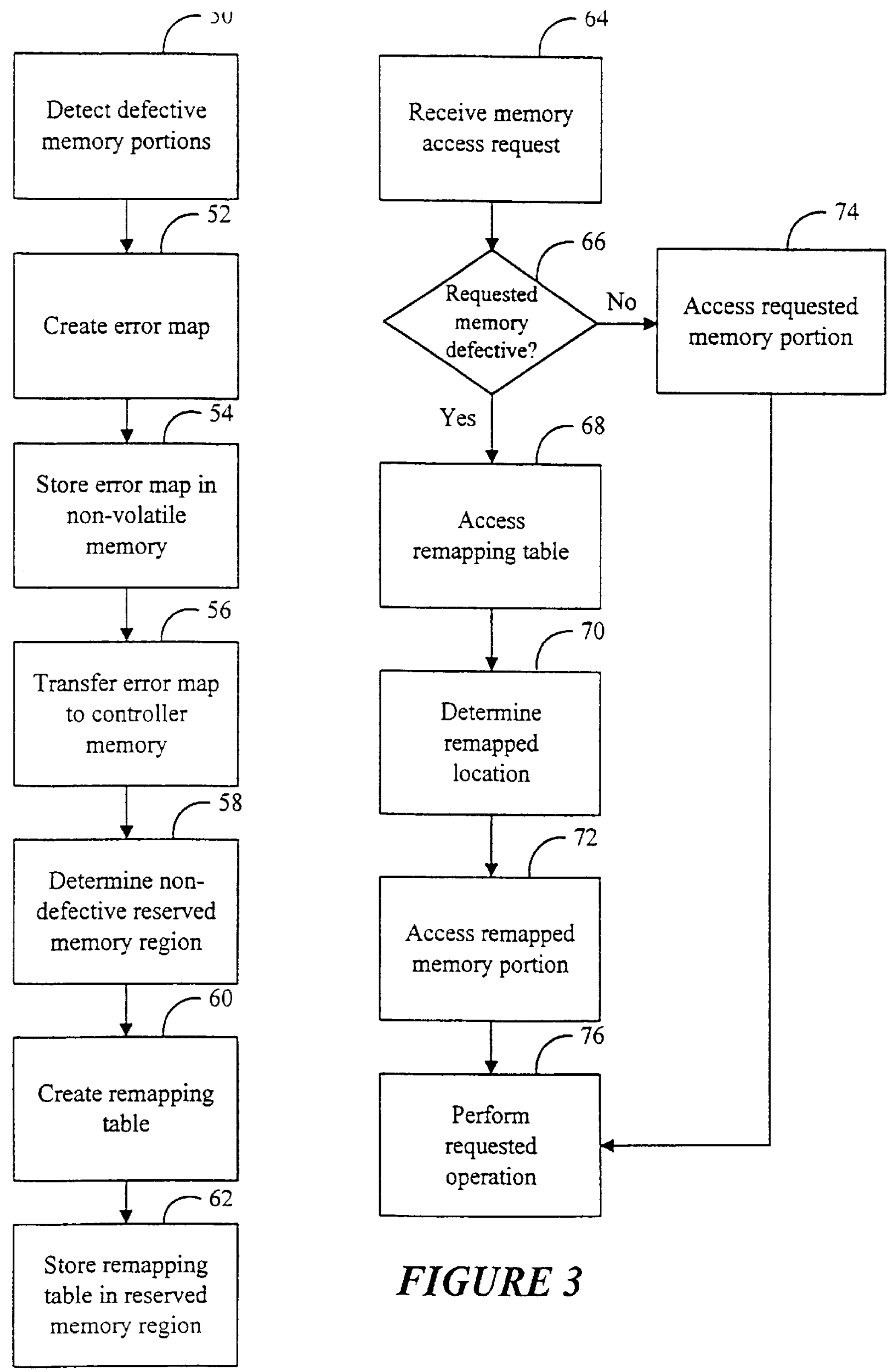
FIG. 2 is a flow diagram showing steps used to remap defective memory locations of a memory module according to a preferred embodiment of the present invention.
FIG. 3 is a flow diagram showing how a memory access request is processed according to a preferred embodiment of the present invention.

A flow chart showing the software executed by the processor 36 to remap defective memory locations of the memory module 14 according to a preferred embodiment of the present invention is shown in FIG. 2. In step 50, the defective memory portions of the volatile memory block 14 of the memory module 12 are detected. In step 52, the error map 18 is created which includes an error tag for each of the defective memory portions detected in step 50. In step 54, the error map 18 is stored in the nonvolatile memory block 16 of the memory module 12.

Although the steps 50–54 may be performed by the processor 36 as explained above, they are preferably performed at the facility in which the memory module 12 is manufactured. The memory module 12 then can be incorporated into the computer system 10 by a computer manufacturer or a user desiring to upgrade the computer system 10. However, performing steps 50–54 after the memory module 12 has been incorporated in the computer system 10 enables the error map 18 to be updated to reflect newly defective memory portions of the volatile memory block 14 that have become defective after the memory module 12 has been used as part of the computer system 10. The memory controller processor 36 can determine that a memory portion of the volatile memory block 14 has become defective by writing data to the memory portion and then attempting to read the data from the memory portion. If the data read from the memory portion does not match the data written to the memory portion, then the memory portion is determined to be defective. The memory controller processor 36 then can modify the error map 18 so that the error map indicates that the newly defective memory portion is defective. If it is desired to enable the error map 18 to be so modified, the nonvolatile memory block 16 preferably is an EEPROM or other nonvolatile memory type that can be modified without removing the nonvolatile memory block 16 from the computer system 10.

In response to a user turning ON the computer system 10, in step 56 the a copy of the error map 18 is transferred from the nonvolatile memory block 16 to the memory 38 of the memory controller 20. Step 58 determines the location of the non-defective reserved memory region 42 of the volatile memory block 14. In step 60, the remapping table 40 is created which maps the defective memory portions determined in step 50 to non-defective memory portions in the reserved memory region 42 determined in step 58. In step 62, the remapping table created in step 60 is stored in the reserved memory region 42 determined in step 58.

Upon completion of steps 50–60 of FIG. 2, the computer system 10 is ready to respond to requests for access to memory portions of the volatile memory block 14. A flow chart of the software executed by the processor 36 to process a memory access request according to the preferred embodiment of the present invention is shown in FIG. 3. In step 64, a memory access request is received from a memory requester, such as the system processor 24. The memory access request can be a request to write data to or read data from a requested memory portion of the volatile memory block 14. Typically, such a memory access request will include an indication of whether a read or a write is being requested together with an address of the requested memory portion of the volatile memory block 14.

Step 66 determines whether the requested memory portion of the volatile memory block 14 is defective. The memory controller processor 36 performs step 66 by determining whether the error map 18A includes an error tag for the address of the requested memory portion. If the error map 18A indicates that the requested memory portion is defective, then the remapping table 40 is accessed in step 68 in the volatile memory block 14. Step 68 determines from the remapping table 40 the remapped memory portion to which the requested memory portion was mapped. In step 72, the remapped memory portion indicated by the remapping table 40 is accessed. If step 66 determines that the requested memory portion is not defective, then in step 74 the requested memory portion is accessed. In step 76, the operation requested in the memory access request (e.g., read or write operation) is performed.

Based on the foregoing discussion, it will be understood that the preferred embodiment of the invention enables a memory module with defective memory portions to be employed in a computer system without fear of data being lost by attempting to store the data in the defective memory portions. In the preferred embodiment, the invention creates an error map that identifies the defective memory portions and stores the error map in a nonvolatile memory block of the memory module.

The preferred embodiment then uses the error map to create a remapping table that maps each of the defective memory portions to non-defective memory portions. The error map and remapping table then are used to ensure that any requests for access to one of the defective memory portions is instead directed to one of the non-defective portions. The preferred embodiment of the invention requires much less memory overhead than prior art error correction schemes that require one or more bits to be added to every data word stored in memory. Moreover, unlike prior art, error corrections schemes that correct only single-bit errors, the present invention prevents multiple bit errors caused by defective memory portions.

It should be understood that even though numerous advantages of the present invention have been set forth in the foregoing description, the above disclosure is illustrative only. Changes may be made in detail and yet remain within the broad principles of the present invention.

I claim:

1. A method of interfacing a memory module with a memory requester using a memory controller, the method comprising:

storing an error map that identifies defective memory portions of the memory module;

creating, from the error map, a remapping table that maps each of the defective memory portions to a non-defective memory portion in the memory module;

receiving from the memory requester a request for access to a requested memory portion of the memory module;

determining from the error map whether the requested memory portion is one of the defective memory portions;

determining from the remapping table the non-defective memory portion to which the requested memory portion was mapped if the error map indicates that the requested memory portion is one of the defective memory portions;

accessing the non-defective memory portion determined from the remapping table if the error map indicates that the requested memory portion is one of the defective memory portions; and accessing the requested memory portion if the error map does not indicate that the requested memory portion is one of the defective memory portions.

2. The method of claim 1 wherein the memory module comprises a volatile memory block and a nonvolatile memory block, the defective and non-defective memory portions being volatile memory portions of the volatile memory block, and wherein the storing step includes storing the error map in the nonvolatile memory block.

3. The method of claim 2, further comprising:

transferring a copy of the error map from the memory module to a memory controller; and storing the copy of the error map in the memory controller, wherein the memory controller determines from the copy of the error map whether the requested memory portion is one of the defective memory portions.

4. The method of claim 2, further comprising:

storing the remapping table in a non-defective memory portion of the volatile memory block.

5. The method of claim 1 wherein the step of creating the remapping table includes:

using the error map to identify a defective memory portion of the memory module;

using the error map to identify a non-defective memory portion of the memory module; and associating an address of the identified defective memory portion with an address of the identified non-defective memory portion.

6. The method of claim 1 wherein the identified defective memory portions comprise four kilobyte blocks of memory locations in the memory module.

7. The method of claim 1 wherein one of the identified defective memory portions comprises a newly-defective memory portion that has become defective after the memory module has been used in a computer system including the memory requester and the memory controller.

8. A method of controlling a memory module using a memory controller, the method comprising:

determining that at least one volatile memory portion of the memory module is defective;

creating an error map that identifies which volatile memory portions of the memory module are defective;

storing the error map in a nonvolatile memory block of the memory module;

transferring the error map from the memory module to the memory controller; and creating a remapping table based on the error map, the remapping table mapping each defective volatile memory portion to a non-defective volatile memory portion in the memory module so that the non-defective volatile memory portion is accessed when the defective volatile memory portion is requested.

9. The method of claim 8, further comprising:

receiving from a memory requester a request for access to a requested memory portion of the memory module;

determining from the error map whether the requested memory portion is one of the defective memory portions;

determining from the remapping table the non-defective memory portion to which the requested memory portion was mapped if the error map indicates that the requested memory portion is one of the defective memory portions;

accessing the non-defective memory portion determined from the remapping table if the error map indicates that the requested memory portion is one of the defective memory portions; and accessing the requested memory portion if the error map does not indicate that the requested memory portion is one of the defective memory portions.

10. The method of claim 8, further comprising:

storing the error map in the memory controller, wherein the memory controller determines from the error map stored in the memory controller whether the requested memory portion is one of the defective memory portions.

11. The method of claim 8, further comprising:

storing the remapping table in a non-defective volatile memory portion of the memory module; and accessing the remapping table to identify the non-defective volatile memory portion to which a requested volatile memory portion has been mapped if the requested volatile memory portion is one of the defective volatile memory portions.

12. The method of claim 8 wherein the step of creating the remapping table comprises:

using the error map to identify a defective memory portion of the memory module;

using the error map to identify a non-defective memory portion of the memory module; and associating an address of the identified non-defective memory portion with the identified defective memory portion.

13. The method of claim 8 wherein the defective volatile memory portions identified by the error map comprise four kilobyte blocks of memory locations in the memory module.

14. The method of claim 8, further comprising:

determining that a newly-defective one of the volatile memory portions of the memory module has become defective after the memory module has been used as part of a computer system that includes the memory controller; and amending the remapping table so that the remapping table maps the newly-defective memory portion to a non-defective volatile memory portion of the memory module.

15. The method of claim 1, further comprising creating the error map by creating a tag bit for each memory portion of the memory module, each tag bit being of a first logic value if a memory portion associated with the tag bit is defective and being of a second logic value if the memory portion associated with the tag bit is non-defective.

16. The method of claim 8, further comprising creating the error map by creating a tag bit for each memory portion of the memory module, each tag bit being of a first logic value if a memory portion associated with the tag bit is defective and being of a second logic value if the memory portion associated with the tag bit is non-defective.

17. A method of controlling a memory module having memory portions, the method comprising:

storing an error map that identifies which memory portions of the memory module are defective;

creating a remapping table based on the error map, the remapping table mapping each defective memory portion to a non-defective memory portion in the memory module; and using the remapping table to access the non-defective volatile memory portion when the defective volatile memory portion is requested.

18. The method of claim 17 wherein the storing step includes storing the error map in a nonvolatile memory block of the memory module, the method further comprising storing the remapping table in a volatile memory block of the memory module.

19. The method of claim 17, further comprising:

receiving from a memory requester a request for access to a requested memory portion of the memory module;

determining from the error map whether the requested memory portion is one of the defective memory portions;

determining from the remapping table the non-defective memory portion to which the requested memory portion was mapped if the error map indicates that the requested memory portion is one of the defective memory portions;

accessing the non-defective memory portion determined from the remapping table if the error map indicates that the requested memory portion is one of the defective memory portions; and accessing the requested memory portion if the error map does not indicate that the requested memory portion is one of the defective memory portions.

20. The method of claim 17, further comprising:

storing the error map in a memory controller that controls access to the memory module, wherein the memory controller determines from the error map stored in the memory controller whether the requested memory portion is one of the defective memory portions.

21. The method of claim 17, further comprising:

storing the remapping table in a non-defective volatile memory portion of the memory module; and accessing the remapping table to identify the non-defective volatile memory portion to which a requested volatile memory portion has been mapped if the requested volatile memory portion is one of the defective volatile memory portions.

22. The method of claim 17 wherein the step of creating the remapping table comprises:

using the error map to identify a defective memory portion of the memory module;

using the error map to identify a non-defective memory portion of the memory module; and associating an address of the identified non-defective memory portion with the identified defective memory portion.

23. The method of claim 17 wherein the defective memory portions identified by the error map comprise four kilobyte blocks of memory locations in the memory module.

24. The method of claim 17, further comprising:

determining that a newly-defective one of the volatile memory portions of the memory module has become defective after the memory module has been used as part of a computer system that includes the memory controller; and amending the remapping table so that the remapping table maps the newly-defective memory portion to a non-defective volatile memory portion of the memory module.

25. The method of claim 17, further comprising creating the error map by creating a tag bit for each memory portion of the memory module, each tag bit being of a first logic value if a memory portion associated with the tag bit is defective and being of a second logic value if the memory portion associated with the tag bit is non-defective.

* * * * *